(12) United States Patent
Lin et al.

(10) Patent No.: US 11,527,391 B1
(45) Date of Patent: *Dec. 13, 2022

(54) POSITION-DETECTABLE SHIELDING DEVICE AND THIN-FILM-DEPOSITION EQUIPMENT WITH THE SAME

(71) Applicant: SKY TECH INC., Hsinchu County (TW)

(72) Inventors: Jing-Cheng Lin, Hsinchu County (TW); Yu-Te Shen, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/506,105

(22) Filed: Oct. 20, 2021

(30) Foreign Application Priority Data

Sep. 28, 2021 (TW) .................................. 110136122

(51) Int. Cl.
*H01J 37/34* (2006.01)
*C23C 14/34* (2006.01)

(52) U.S. Cl.
CPC .......... *H01J 37/3441* (2013.01); *C23C 14/34* (2013.01); *H01J 2237/332* (2013.01)

(58) Field of Classification Search
CPC ............... H01J 37/3441; H01J 37/3447; H01J 37/3444; H01J 37/32651

USPC ...................................................... 204/298.11
See application file for complete search history.

(56) References Cited

U.S. PATENT DOCUMENTS

| | | | | |
|---|---|---|---|---|
| 2003/0155234 A1* | 8/2003 | Feltsman | ............... | C23C 14/566 118/712 |
| 2004/0182698 A1* | 9/2004 | Feltsman | ............... | C23C 14/566 204/298.11 |
| 2019/0316251 A1* | 10/2019 | Tsai | ...................... | C23C 14/021 |

* cited by examiner

*Primary Examiner* — Rodney G McDonald
(74) *Attorney, Agent, or Firm* — Chun-Ming Shih; HDLS IPR Services

(57) ABSTRACT

The present disclosure provides a position-detectable shielding device, which includes a first-shield member, a second-shield member, a driver and two position sensors. The driver includes a motor, an outer tube and a main shaft within the outer tube. The motor is connected to the first-shield member and the second-shield member, respectively via the outer tube and the main shaft. Such that, the motor drives and swings the two shield members between a shielding state and an open state. The two position sensors are respectively disposed for detecting that the outer tube has rotated to a first position where the first-shield member is in the open state, and for detecting that the outer tube has rotated to a second position where the first-shield member is in the shielding state, thereby to confirm that the two shield members are exactly at the preset shielding state or the open state.

20 Claims, 12 Drawing Sheets

POSITION-DETECTABLE SHIELDING DEVICE AND THIN-FILM-DEPOSITION EQUIPMENT WITH THE SAME

CROSS-REFERENCE TO RELATED APPLICATIONS

This non-provisional application claims priority claim under 35 U.S.C. § 119(a) on Taiwan Utility Model No. 110136122 filed on Sep. 28, 2021, the entire contents of which are incorporated herein by reference.

TECHNICAL FIELD

The present disclosure relates to a position-detectable shielding device and a thin-film-deposition equipment with the same, which mainly employ position sensors to detect different angles of an outer tube and/or a main shaft of shaft seal, for confirming shielding state and open state of the shielding device.

BACKGROUND

Thin-film-deposition equipments, such as chemical-vapor deposition (CVD), physical-vapor deposition (PVD) and the atomic-layer deposition (ALD) equipments, those are commonly employed in manufacturing process of semiconductors, light-emitting diodes and displays, etc.

A thin-film-deposition equipment mainly includes a chamber and a substrate carrier, wherein the substrate carrier is within the chamber for carrying at least one substrate. To exemplify by PVD, a target material is required to dispose within the chamber, wherein the target material faces the substrate on the substrate carrier. When performing PVD, noble gas or reactive gas is transferred into the chamber, then bias electricity is applied on the target material and the substrate carrier respectively, also the substrate carried on by the substrate carrier is heated up.

The noble gas or reactive gas within the chamber transforms into ionized gas in effect of a high-voltage electric field, then the ionized gas is attracted by the bias electricity to bombard the target material. Thereby, atoms or molecules splashed from the target material are attracted by the bias electricity on the substrate carrier, then be deposited on surface of the substrate and forms a thin film on the surface of the substrate.

After some time of usage, an inner-edge surface of the chamber may also be formed with thin film, then a periodic cleaning is required to perform to the chamber, in order to prevent the waste thin film from dropping onto the substrate and causing pollution during the process of thin-film deposition. Moreover, surface of the target material may be formed with oxide or other pollutant, therefore requires a periodic cleaning as well. Generally, a burn-in process is applied to bombard the target material within the chamber by plasma ions, then to remove the oxides or pollutants on the surface of target material.

To perform the abovementioned cleaning process, the substrate carrier and the substrate must be extracted or kept out, to prevent the removed pollutant from turning to pollute the substrate carrier and the substrate, during the cleaning process.

SUMMARY

Generally, after some time of usage, the thin-film-deposition equipment is required for cleaning, in order to remove the waste thin film within the chamber and the oxide or nitride on the target material. During the cleaning process, some removed pollutant particles may turn to pollute the substrate carrier (hereafter as "carrier"), thus there is a need to keep out the substrate carrier from the removed pollutant. The present disclosure provides a shielding device and a thin-film-deposition equipment with the same, which mainly employs a driver to rotate and swing two shield members in opposite rotational directions to approach or leave each other, such that to operate between a shielding state and an open state. Thereby, the shield members in shielding state can cover and shield the substrate carrier, to prevent the removed pollutant particles from turning to pollute the substrate carrier during the process of cleaning the chamber or the target material.

During a process of cleaning the reaction chamber, the driver swings the two shield members to approach each other, such that the two shield members come together to cover the carrier within a containing space, in order to prevent a plasma employed to proceed the cleaning or some removed waste pollutant from turning to pollute the substrate carrier and/or the substrate thereon. Alternatively, during a process of performing the deposition, the driver swings the two shielding members to leave each other, such that to permit the process to proceed on the substrate within the reaction chamber.

An object of the present disclosure is to provide a thin-film-deposition equipment with shielding device, which includes a reaction chamber, a carrier and a position-detectable shielding device. The shielding device includes a driver, two shield members, two first-position sensors and two second-position sensors. Also, the driver is connected to the two shield members, for respectively driving the two shield members to sway in opposite rotational directions and thereby to move between an open state and a shielding state.

The driver includes two motors and a shaft seal, wherein the two motors is connected to two shield members respectively via the outer tube and the main shaft of the shaft seal, such that to drive and swing the two shield members. The two first-position sensors are adjacent to the outer tube, for respectively detecting and confirming a first position and a second position of the outer tube. The two second-position sensors are adjacent to the main shaft, for respectively detecting and confirming a third position and a fourth position of the main shaft. When the outer tube rotates to the first position and the main shaft rotates to the third position, the two shield members is conformed to be operated into the open state. Then, when the outer tube rotates to the second position, and the main shaft rotates to the fourth position, the two shield members is conformed to be operated into the shielding state.

By virtue of the first-position sensor and the second-position sensor, it is able to detect and confirm if the outer tube and the main shaft have rotated to preset positions and are operated into the open state or the shielding state. Such that, it is able to prevent the thin-film-deposition equipment from performing a burn-in process when the two shield members are not exactly operated into the shielding state, and hence to prevent causing pollution to the carrier and other portions within the reaction chamber. Also, it is able to prevent the thin-film-deposition equipment from moving the carrier when the two shield members are not exactly in the open state, and hence to prevent causing collision.

To achieve the abovementioned object, the present disclosure provides a thin-film-deposition equipment, which includes: a reaction chamber having a containing space; a carrier disposed within the containing space for carrying at least one substrate; a position-detectable shielding device, and two first-position sensors adjacent to the outer tube. The position-detectable shielding device includes: a first-shield member disposed within the containing space; a second-shield member disposed within the containing space; a driver including at least one motor; a shaft seal including an outer tube and a main shaft contained within the outer tube. The motor is connected to the first-shield member via the outer tube and connected to the second-shield member via the main shaft, the motor drives and swings the first-shield member and the second-shield member in opposite rotational directions respectively via the outer tube and the main shaft, such that to switch the first-shield member and the second-shield member between an open state and a shielding state. Also, in the shielding state, the first-shield member and the second-shield member approach each other to cover the carrier together. Moreover, in the open state, the first-shield member and the second-shield member have an open space therebetween. The two first-position sensors are adjacent to the outer tube, wherein the two first-position sensors have a distance therebetween, one of the two first-position sensors is for detecting that the outer tube has rotated to a first position, and another one of the two first-position sensors is for detecting that the outer tube has rotated to a second position.

The present disclosure also provides the abovementioned position-detectable shielding device, which can be adapted to thin-film-deposition equipment(s).

Furthermore, the present disclosure provides the abovementioned thin-film-deposition equipment, which further includes two sensor areas connected to the reaction chamber, and two shield sensors respectively disposed on the two sensor areas, wherein the two shield sensors are for respectively detecting the first-shield member and the second-shield member that enter the two sensor areas in the open state.

Moreover, the present disclosure provides the abovementioned thin-film-deposition equipment and the position-detectable shielding device, wherein: the first-shield member includes a first-inner-edge surface formed with at least one protrusion; the second-shield member includes a second-inner-edge surface formed with at least one cavity corresponding to the protrusion of the first-inner-edge surface.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
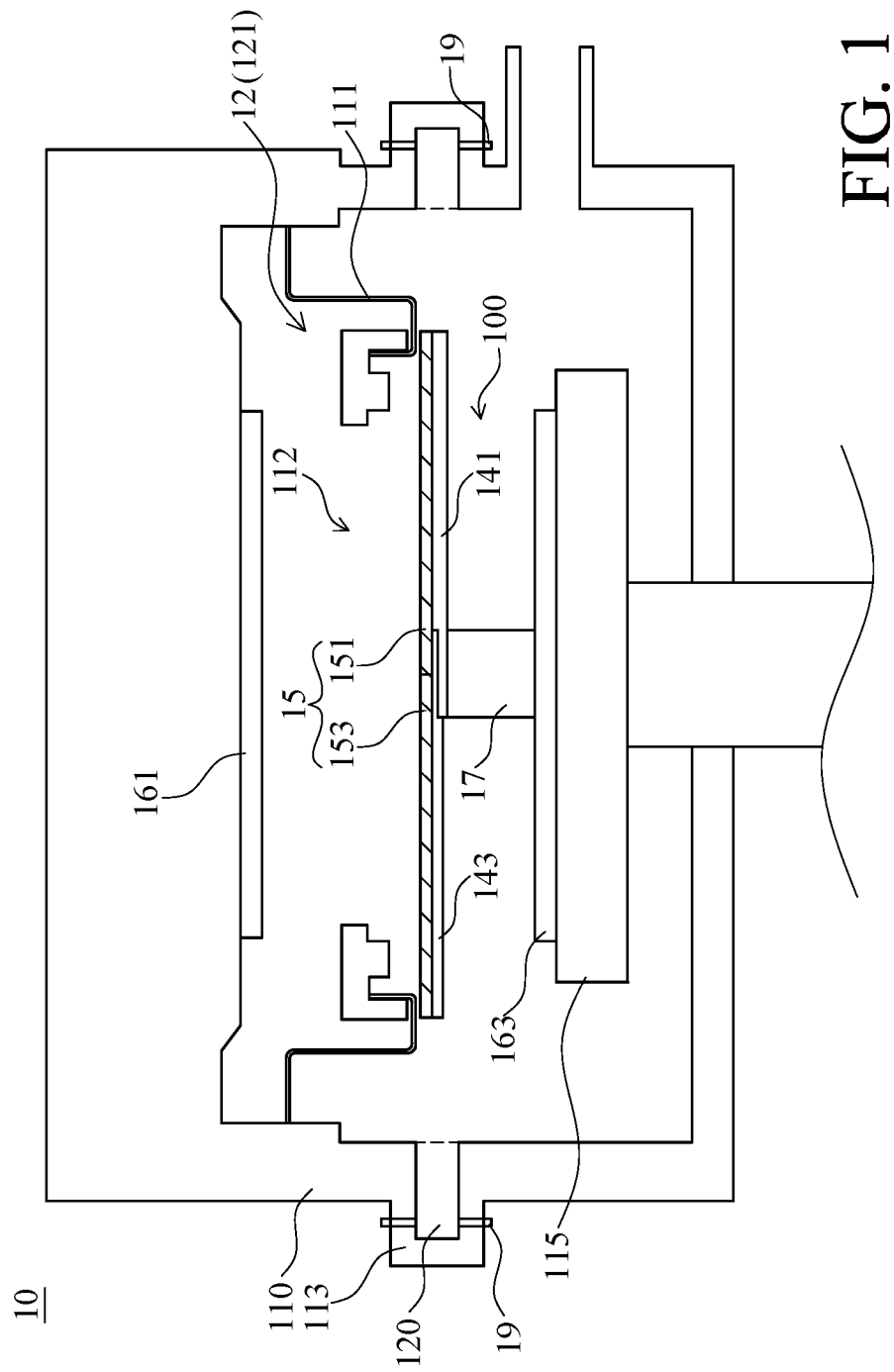
FIG. 1 is a schematic sectional view illustrating a position-detectable shielding device of a thin-film-deposition equipment which is operated into a shielding state, according to one embodiment of the present disclosure.

Referring to FIG. 1, which is a schematic sectional view illustrating a position-detectable shielding device 100 of a thin-film-deposition equipment 10 which is operated in a shielding state, according to one embodiment of the present disclosure. As shown in the FIG, the thin-film-deposition equipment 10 mainly includes a reaction chamber 110, a carrier 115 and a position-detectable shielding device 100, wherein the reaction chamber 110 includes a containing space 12 for containing the carrier 115 and a portion of the shielding device 100.

The carrier 115 is positioned within the containing space 12 of the reaction chamber 110, for carrying at least one substrate 163 (not shown). In this embodiment, the thin-film-deposition equipment 10 is exemplified as a physical-vapor deposition chamber. The reaction chamber 110 is disposed within a target material 161 and has the target material 161 facing the carrier 115. Specifically, the target material 161 may be disposed on a ceiling surface of the reaction chamber 110 to face the carrier 115 and/or the substrate carried thereon within the containing space 12, for example.

Figure 2:
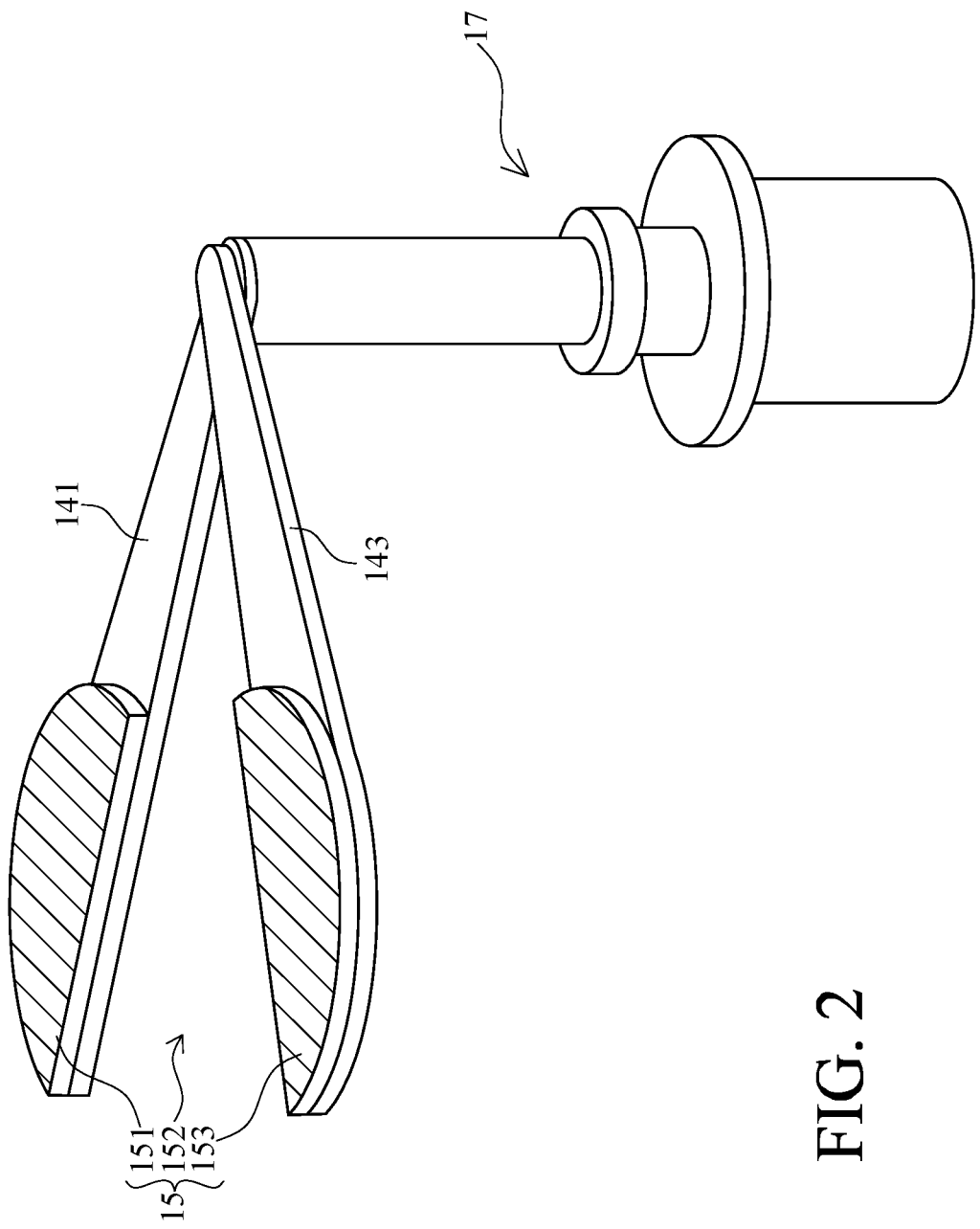
FIG. 2 is a schematic perspective view illustrating the shielding device which is operated into an open state, according to one embodiment of the present disclosure.
Figure 3:
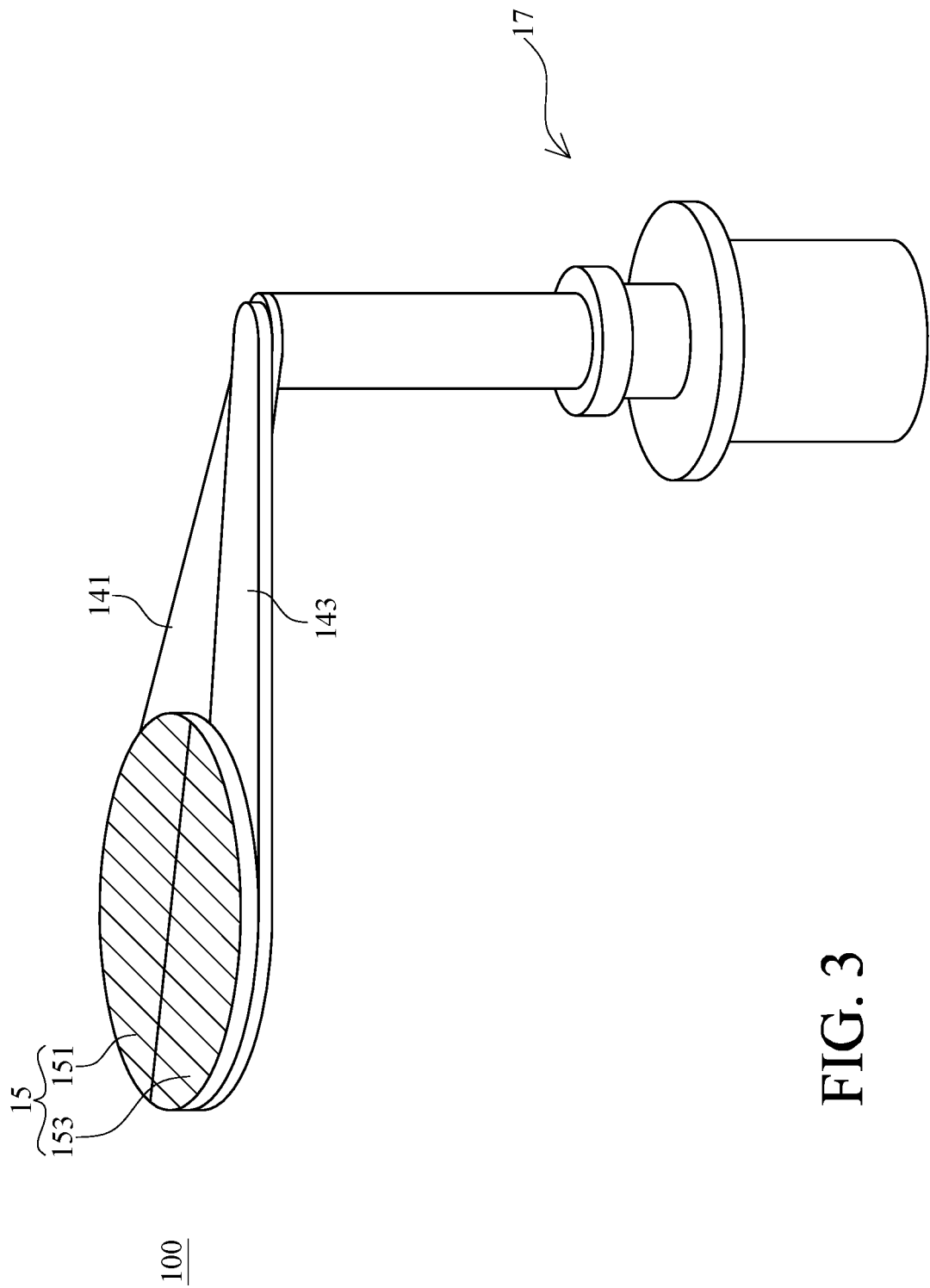
FIG. 3 is a schematic perspective view illustrating the shielding device which is operated into the shielding state, according to one embodiment of the present disclosure.

Referring to FIG. 2 and FIG. 3, the position-detectable shielding device 100 (hereafter as "shielding device") includes a first-shield member 151, a second-shield member 153 and a driver 17, wherein the two shield members 151, 153 are disposed within the containing space 12.

The driver 17 power-transmittably interconnects the first-shield member 151 and the second-shield member 153, such that to drive, swing the first-shield member 151 and the second-shield member 153 in opposite rotational directions, such as to have the two shield members 151, 153 swaying toward or away from each other synchronously, about an axle of the driver 17. Thereby, the driver 17 can drive and swing the two shield members 151, 153 away from each other into an open state, for the thin-film-deposition equipment 10 to perform a deposition process to the substrate 163 carried by the carrier 115. In an opposite manner, the driver 17 can drive and swing the two shield members 151, 153 toward each other into a shielding state, for the thin-film-deposition equipment 10 to perform a cleaning process, wherein the two shield members 151, 153 together cover the carrier 115 to prevent removed pollutants from turning to pollute the carrier 115.

In one embodiment of the present disclosure, the driver 17 power-transmittably interconnects the first-connecting arm 141 and the second-connecting arm 143, wherein the first-connecting arm 141 and the second-connecting arm 143 are for respectively carrying the first-shield member 151 and the second-shield member 153. With such structure, the driver 17 drives, swings the first-shield member 151 and the second-shield member 153 in opposite rotational directions via the first-connecting arm 141 and the second-connecting arm 143.

The first-shield member 151 and the second-shield member 153 may be formed as plates with similar shapes, such as respectively formed as one half and another half of a round plate. Such that, as the driver 17 swings the first-connecting arm 141 and the second-connecting arm 143 to respectively move the first-shield member 151 and the second-shield member 153 toward each other, the two shield members 151, 153 come together and form a whole round shield 15, for covering and shielding the carrier 115 and/or the substrate 163 thereon.

However, the two shield members 151, 153 with half-round appearances are merely one embodiment of the present disclosure, in other embodiment, the shield members 151, 153 may be formed in different geometric shapes, such as rectangular shapes, or triangular shapes, etc. Moreover, the two shield members 151, 153 may also be formed with different area sizes, or even be disposed in different heights and overlap when in the shielding state (e.g. the first-shield member 151 partially on top of the second-shield member 153) for a better coverage.

Moreover, a manner of the first-shield member 151 and the second-shield member 153 being operated into the shielding state, which is defined as the first-shield member 151 and the second-shield member 153 continue to approach each other, until a distance between the two shield members 151, 153 is less than a threshold value, such as 1 millimeter (mm). To be specific, the first-shield member 151 and the second-shield member 153 do not actually contact each other, such that to avoid a collision or friction therebetween, which may create some wear-off particles therefrom to pollute the containing space 12 of the reaction chamber 110 and/or the carrier 115 therein.

Figure 4:
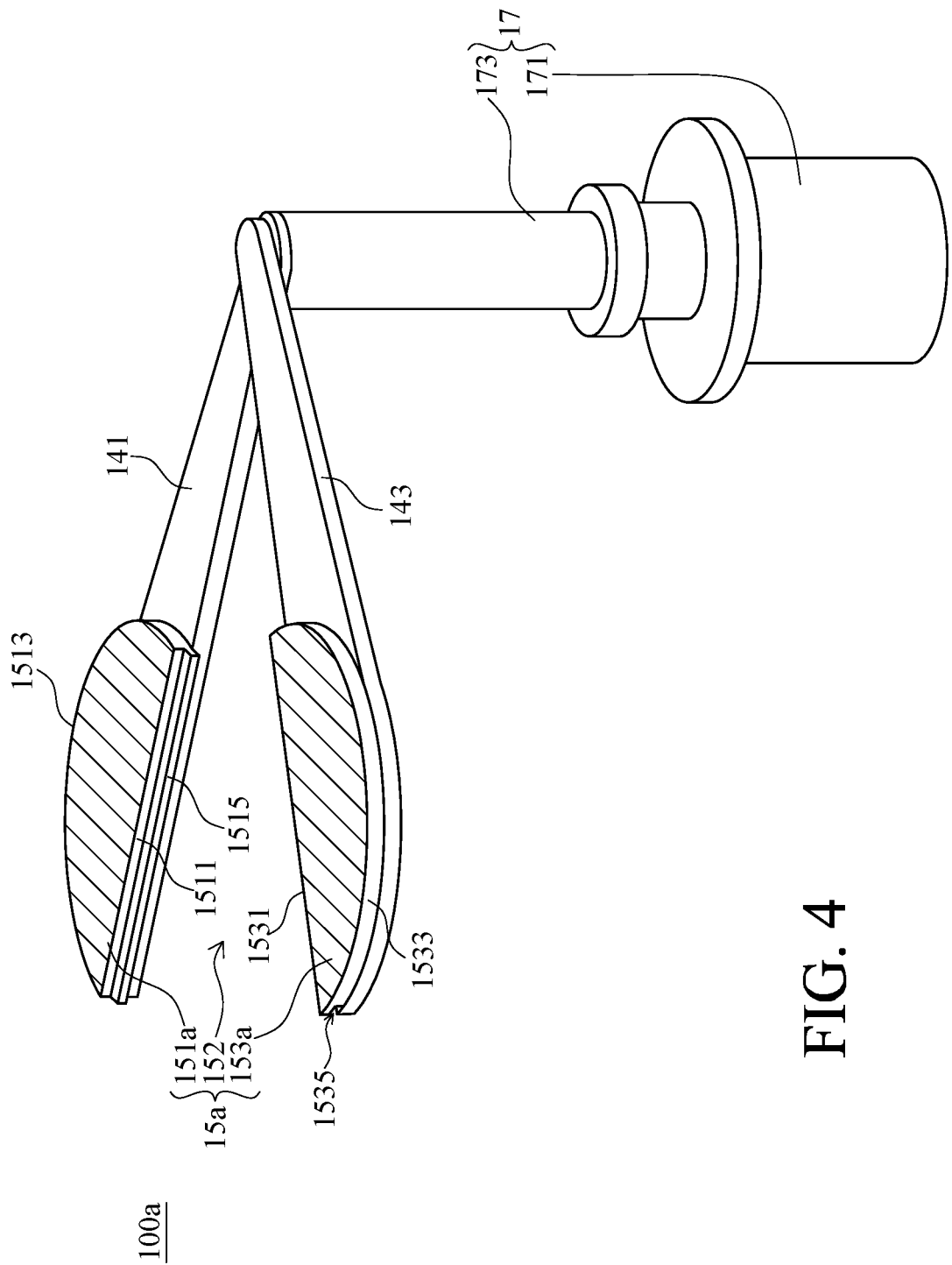
FIG. 4 is a schematic perspective view illustrating the shielding device which is operated into the open state, according to a different embodiment of the present disclosure.

Referring to FIG. 4, which is a schematic perspective view illustrating the shielding device 100a of the thin-film-deposition equipment which is in the open state, according to another embodiment of the present disclosure. The shielding device 100a in this embodiment is similar to that in aforementioned embodiments, but different in structures of the first-shield member 151a and the second-shield member 153a. The first-shield member 151a has a first-inner-edge surface 1511 and a second-inner-edge surface 1531, wherein the first-inner-edge surface 1511 is formed with at least one protrusion 1515, in the other hand, the second-inner-edge surface 1531 is formed with at least one cavity 1535. Furthermore, the protrusion 1515 on the first-inner-edge surface 1511 corresponds to the cavity 1535 on the second-inner-edge surface 1531, and the protrusion 1515 is formed slightly smaller than the cavity 1535.

Furthermore, in this embodiment, when the first-shield member 151a and the second-shield member 153a are operated in the shielding state, between the first-shield member 151a and the second-shield member 153a, the first-inner-edge surface 1511 and the second-inner-edge surface 1531 are adjacent to each other and maintain a gap space therebetween, meanwhile, the protrusion 1515 on the first-inner-edge surface 1511 enters the cavity 1535 on the second-inner-edge surface 1531 but still maintain the gap space, and thus no contact between the two shield member 151a, 153a. Also, similar to the aforementioned embodiment, the gap space between the first-inner-edge surface 1511 and the second-inner-edge surface 1531 is configured less than the aforementioned threshold value, such as 1 mm.

With such structure, during the cleaning process, as the two shield members 151a, 153a are operated into the shielding state, the protrusion 1515 on the first-inner-edge surface 1511 enters the cavity 1535 on the second-inner-edge surface 1531 to cover the gap space, such that to prevent the removed pollutants from straightly passing through the gap space then contacting the carrier 115 behind.

Also, similar to the aforementioned embodiment, the first-shield member 151a and the second-shield member 153a are formed as half-round plates, with straight and flat inner-edge surfaces 1512, 1532. However, the present disclosure is mot limited thereto, in other embodiment, the inner-edge surfaces may be formed in concave and convex shapes or zig-zag shapes, or even inclined planes but still corresponding to each other.

Figure 5:
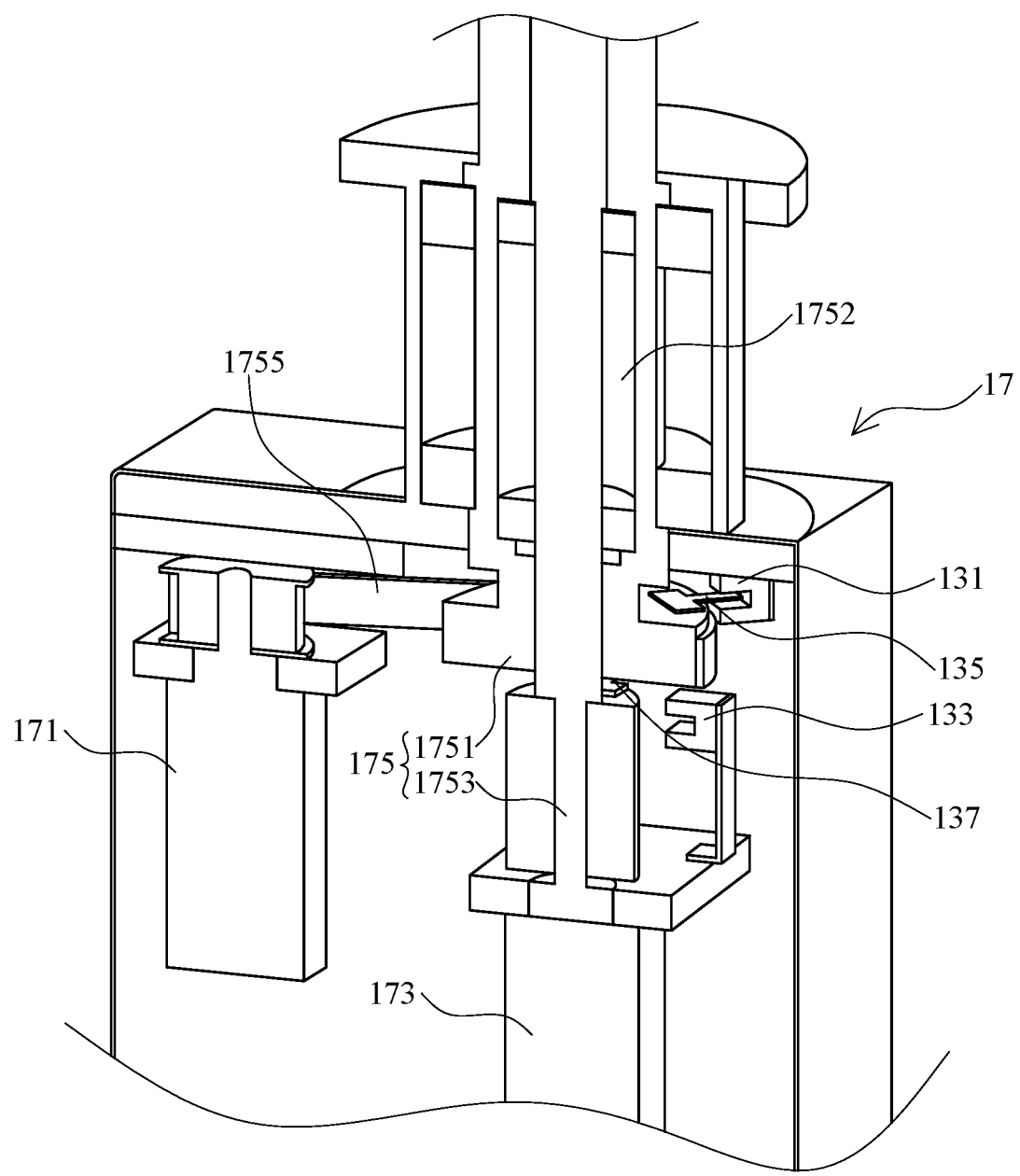
FIG. 5 is a schematic perspective sectional view illustrating a driver of the shielding device, according to one embodiment of the present disclosure.

In one embodiment of the present disclosure as shown in FIG. 5, the driver 17 includes a first motor 171, a second motor 173 and a shaft seal 175. In more detail, the shaft seal 175 includes an outer tube 1751, and a main shaft 1753 contained within the outer tube 1751, also, the outer tube 1751 and the main shaft 1753 are disposed in a coaxial manner and are rotatable relative to each other.

The shaft seal 175 may be a common shaft seal component, which is mainly for isolating the containing space 12 of the reaction chamber 110 from an outside thereof and maintaining a vacuum condition within the containing space 12. In a different embodiment of the present disclosure, the shaft seal 175 may be a magnetic liquid rotary sealing, which includes a plurality of bearings, at least one permanent magnet, at least one pole piece and at least one ferrofluid.

The first motor 171 is power-transmittably connected to the first-connecting arm 141 via the outer tube 1751 of the shaft seal 175, such that to turn the outer tube 1751 and hence to swing the first-connecting arm 141 and the first-shield member 151 thereon. In the other hand, The second motor 173 is power-transmittably connected to the second-connecting arm 143 via the main shaft 1753 of the shaft seal 175, such that to turn the main shaft 1753 and hence to swing the second-connecting arm 143 and the second-shield member 153 thereon.

Figure 6:
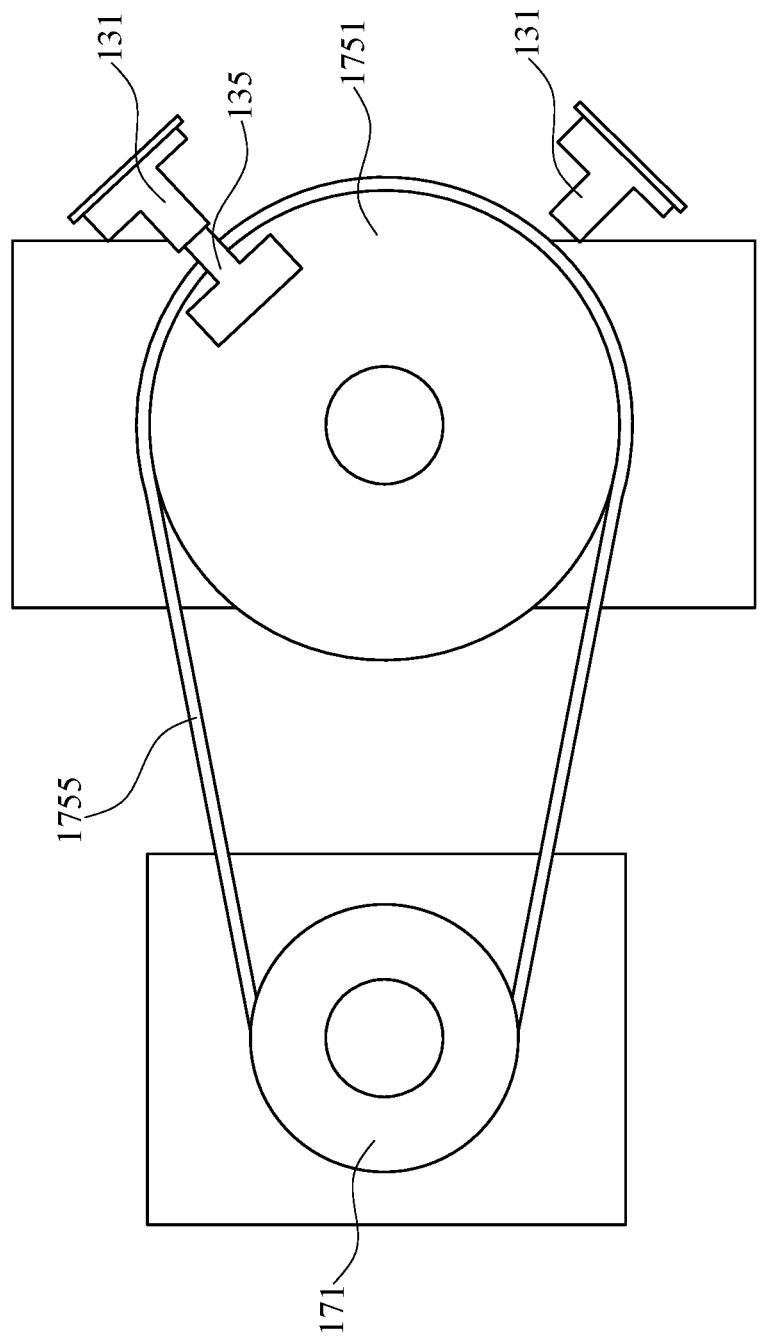
FIG. 6 is a schematic top view illustrating the driver of the shielding device, according to one embodiment of the present disclosure.

In one embodiment of the present disclosure, as shown in FIG. 5 and FIG. 6, the first motor 171 drives the outer tube 1751 to rotate via a transmission unit 1755, wherein the transmission unit 1755 may be a conveyor belt, for example. In general, it is possible to calculate a rotation angle or angular position of the outer tube 1751 by detecting, measuring a rotation angle of the first motor 171. However, during an operation of the first motor 171, the transmission unit 1755 as conveyor belt may slip related to the first motor 171 or the outer tube 1751, therefore unable to accurately know if the outer tube 1751 has rotated to a preset angle or angular position of the outer tube 1751 from rotation angle of the first motor 171, and thus unable to confirm if the first-shield member 151 on the outer tube 1751 is exactly in the shielding state or the open state.

Along therewith, the shielding device 100 according to the present disclosure further includes the two first-position sensors 131, which are disposed adjacent to the outer tube 1751 of the shaft seal 175. In more detail, the two first-position sensors 131 have a distance therebetween, such as to be disposed at different angular positions about an axis of the outer tube 1751. To be specific, one of the two first-position sensors 131 is for detecting and confirming if the outer tube 1751 has rotated to a first position (e.g. an angular position or direction) or not, and another one of the two first-position sensors 131 is for detecting and confirming if the outer tube 1751 has rotated to a second position (e.g. an angular position or direction) or not.

In this embodiment, when the outer tube 1751 rotates to the first position, the first-shield member 151 connected thereto is operated into the open state, and when the outer tube 1751 rotates to the second position, the first-shield member 151 is operated into the shielding state. Basically, the outer tube 1751 and the first-shield member 151 are fastened to each other thus no relative movement or rotation therebetween. Therefore, it is enough to confirm and ensure the first-shield member 151 is in the shielding state or the open state, when one of the first-position sensors 131 detected that the outer tube 1751 has rotated to the first position or the second position.

Figure 7:
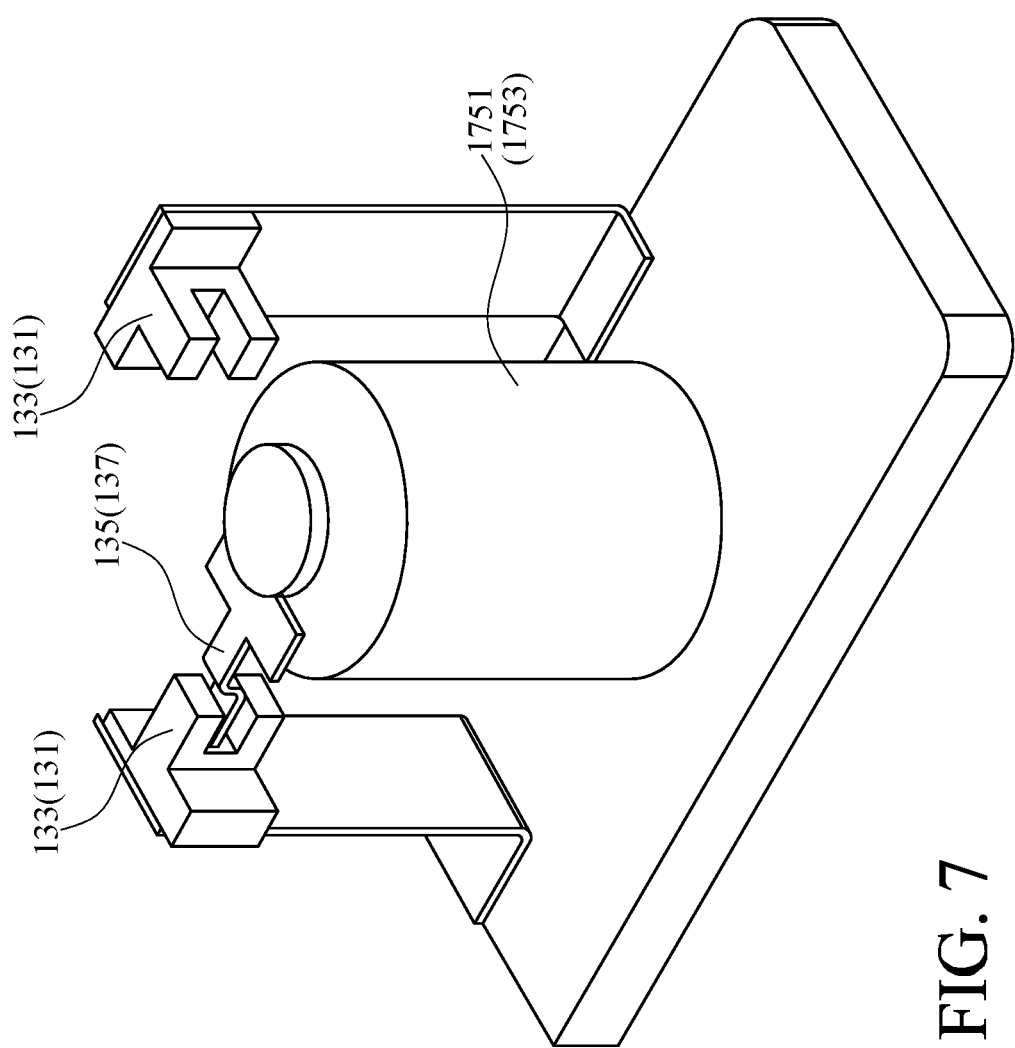
FIG. 7 is a schematic perspective view illustrating the driver, according to one embodiment of the present disclosure.
Figure 8:
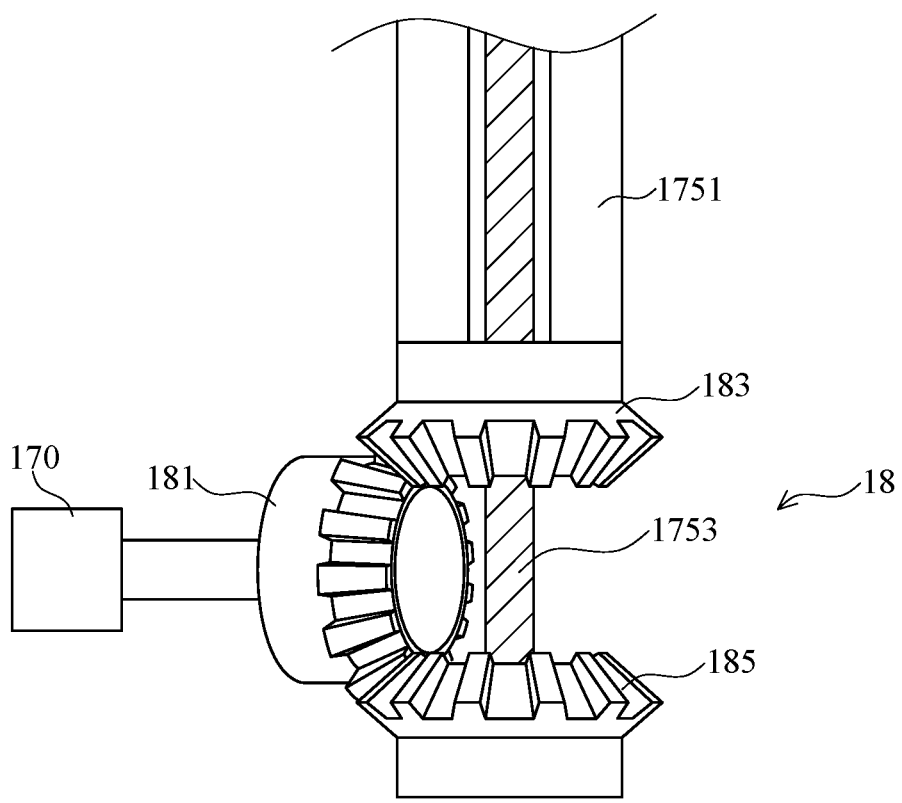
FIG. 8 is a schematic perspective sectional view illustrating the driver, according to another embodiment of the present disclosure.

In one embodiment of the present disclosure, as shown in FIG. 6 and FIG. 7, the outer tube 1751 may be disposed with a first-tongue unit 135 which protrudes radially-outward therefrom. For example, the first-tongue unit 135 may be a plate or sheet formed with a pointing end and fastened on the outer tube 1751 by bolt(s) or welding, etc. When the outer tube 1751 rotates, the first-tongue unit 135 also turns to have the pointing end thereof to intersect and be detected by the first-position sensors 131.

To be specific, each of the first-position sensors 131 in this embodiment is an optical sensor, which includes an emitter which continues emitting signal, and a receiver which continues receiving the signal from the emitter. When the first-tongue unit 135 moves or turns to get between the emitter and receiver of the first-position sensor 131 corresponding to the first position, the signal from the emitter is blocked and such that the sensor 131 detects that the outer tube 1751 has rotated to the first position. Similar manner for another one of the first-position sensor 131 corresponding to the second position, when the first-tongue unit 135 turns to block the signal from the emitter of the another first-position sensor 131, the another first-position sensor 131 then detects that the outer tube 1751 has rotated to the second position.

In one embodiment of the present disclosure, the shielding device 100 may be further disposed with two second-position sensors 133 adjacent to the main shaft 1753 of the shaft seal 175. Similar to the first-position sensors 131, the two second-position sensors 133 also have a distance therebetween and are disposed at different angular positions about an axis of the mean shaft 1753, wherein one of the two second-position sensors 133 is for detecting and confirming if the main shaft 1753 has rotated to a third position (e.g. an angular position or direction) or not, and another one of the two second-position sensors 133 is for detecting and confirming if the main shaft 1753 has rotated to a fourth position (e.g. another angular position or direction) or not.

In this embodiment, when the main shaft 1753 rotates to the third position, the second-shield member 153 connected thereto is operated into the open state, and when the main shaft 1753 rotates to the fourth position, the second-shield member 153 is operated into the shielding state. As the main shaft 1753 and the second-shield member 153 are fastened to each other and with no relative movement or rotation therebetween, it is enough to confirm the second-shield member 153 is in the shielding state or the open state, by the second-position sensors 133 to detect the third position or the fourth position of the main shaft 1753.

As shown in FIG. 5 and FIG. 7, the main shaft 1753 may be disposed with a second-tongue unit 137, which is similar to the first-tongue unit 135 and which protrudes radially-outward therefrom. Such that, when the main shaft 1753 rotates, the second-tongue unit 137 also turns and has a pointing end thereof to intersect, block signal and be detected by the second-position sensors 133, which are similar to the first-position sensors 131. To be specific, when the second-tongue unit 137 moves or turns to get between an emitter and a receiver of the second-position sensor 133 corresponding to the third position and hence to block signal from the emitter, such that the sensor 131 detects that the main shaft 1753 has rotated to the third position. Similar manner for another one of the second-position sensor 133 corresponding to the fourth position, when the second-tongue unit 137 turns to block the signal from the emitter of the another first-position sensor 131, the another second-position sensor 133 then detects that the main shaft 1753 has rotated to the fourth position.

In the abovementioned embodiment, the first motor 171 is connected to and drives the outer tube 1751 via the transmission unit 1755, and the second motor 173 is directly connected to and drives the main shaft 1753, such that to swing the first-shield member 151 and a second-shield member 153 in the opposition directions. However surely, in other embodiment, it may also be configured to have the first motor 171 directly connected to and driving the outer tube 1751, and to have the second motor 173 connected to and driving the main shaft 1753 via the transmission unit 1755 in an opposite manner, it is only sufficient for the two motors 171, 173 to turn the outer tube 1751 and the main shaft 1755, and hence to swing the two shield members 151, 153 in the opposite rotational directions. Also, as the driver 17 can drive the outer tube 1751 and the main shaft 1755 to rotate in a synchronous manner, the shielding device 100 may be configured to have position sensors 131, 133 and tongue unit 135, 137 disposed to only detect different positions where the outer tube 1751 rotates to (i.e. disposed with the first-position sensors 131 and first-tongue unit 135 only), or disposed to only detect different positions where the main shaft 1755 rotates to, in practical use (i.e. disposed with the second-position sensors 133 and second-tongue unit 137 only).

In a different embodiment of the present disclosure, the driver 17 may be configured to have just one motor 170 to drive and swing the outer tube 1751 and the main shaft 1753 with a gear mechanism 18, such that to swing the first-connecting arm 141 and the second-connecting arm 143 and to further move the first-shield member 151 and the second-shield member 153 in the opposite rotational directions, between the shielding state and the open state.

Specifically, the gear mechanism 18 includes a drive gear 181, a first-passive gear 183 and a second-passive gear 185 both meshing with the drive gear 181. The first-passive gear 183 is connected to the outer tube 1751, the first-connecting arm 141 and the first-shield member 151. In the other hand, the second-passive gear 185 is connected to the main shaft 1753, the second-connecting arm 143 and the second-shield member 153.

Thereby, when the drive gear 181 rotates, the first-passive gear 183 and the second-passive gear 185 rotate in opposite directions, such that to turn the outer tube 1751 to the first position or the second position via the first-passive gear 183, and to turn the main shaft 1753 to the third position or the fourth position via the second-passive gear 185, to further swing the two connecting arms 141, 143 and the two shield members 151, 153 thereon in the opposite rotational directions. Along therewith, the first-position sensors 131 are able detect and confirm the first position and the second position of the outer tube 1751, and the second-position sensors 133 are able detect and confirm the third position and the four angle of the main shaft 1753 as well.

Figure 9:
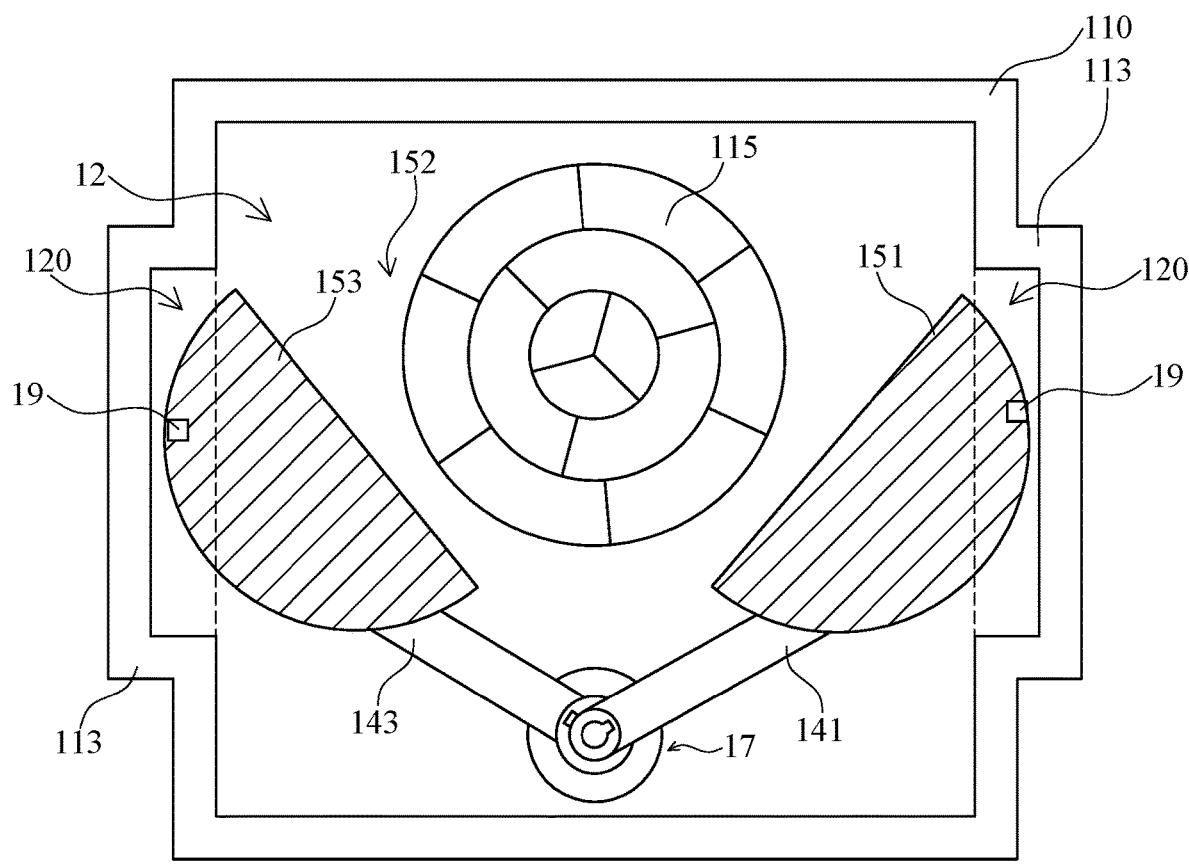
FIG. 9 is a schematic top view illustrating the shielding device of the thin-film-deposition equipment which is in the open state, according to one embodiment of the present disclosure.

As aforementioned, the thin-film-deposition equipment 10 and/or the shielding device 100 according to the present disclosure, which can be operated to switch between two states as the open state and the shielding state. As shown in FIG. 2 and FIG. 9, the driver 11 can drive, swing the first-shield member 151 and the second-shield member 153 to leave each other and move into the open state. In the open state, the first-shield member 151 and the second-shield member 153 have an open space 152 therebetween, such that the first-shield member 151 and the second-shield member 153 do not get between the target material 161 and the carrier 115 with the substrate 163 thereon.

When the first-shield member 151 and the second-shield member 153 are operated into the open state, the carrier 115 can be driven by the elevating unit to approach the target material 161. Thereafter, a process gas (e.g. noble gas) is employed to bombard the target material 161, in order to remove and deposit particles (e.g. atoms or molecules) of the target material 161 and form a thin film on a surface of the substrate carried on the carrier 115.

In one embodiment of the present disclosure as shown in FIG. 1, the containing space 12 of the reaction chamber 110 may be disposed with a tubular blocking member 111, which has one end connected to the ceiling surface of the reaction chamber 110, and another end formed with an opening 112. Such that, when the carrier 115 approaches the target material 161, the carrier 115 also enters the opening 112 or contacts the blocking 111. The reaction chamber 110, the carrier 115 and the blocking member 111 together define a reactive space within the containing space 12, for forming the thin film on the substrate within the reactive space, such that to prevent the blew-off particles of the target material 161 from spreading out of the reactive space and forming undesired thin film outside.

Figure 10:
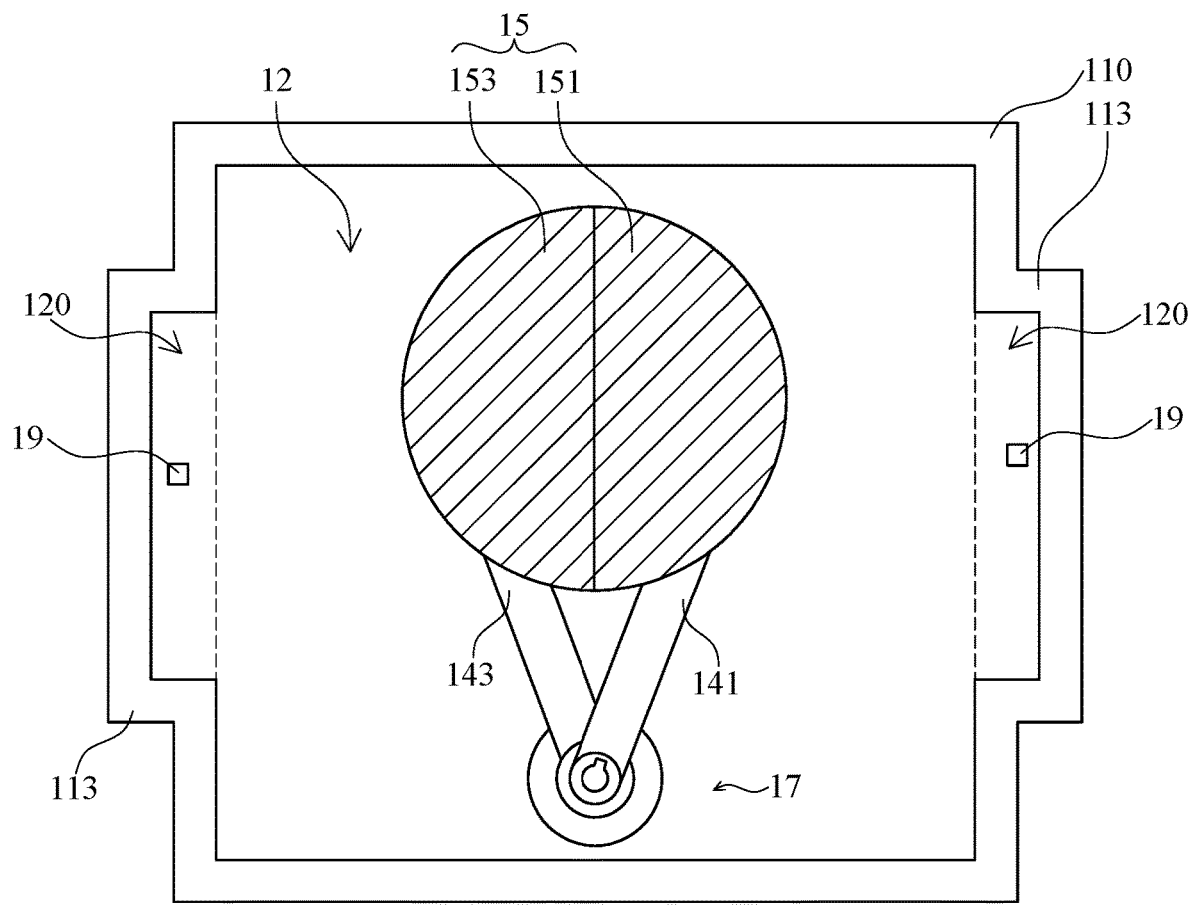
FIG. 10 is a schematic top view illustrating the shielding device of the thin-film-deposition equipment which is in the shielding state, according to one embodiment of the present disclosure.

In the opposite manner, as shown in FIG. 3 and FIG. 10, the driver 17 can drive, swing the first-shield member 151 and the second-shield member 153 to approach each other and move into the shielding state. In the shielding state, the first-shield member 151 and the second-shield member 153 come together and form the whole shield 15 between the target material 161 and the carrier 115, such that to cover and shield the carrier 115 from the target material 161.

As shown in FIG. 1, the shield 15 and the blocking member 111 together can define a cleaning space 121 within the containing space 12, wherein the cleaning space 121 and the aforementioned reactive space have partially or completely spatial overlap. A burn-in process may be performed within the cleaning space 121, to clean the target material 161, the ceiling surface of the reaction chamber 110 and/or an inside of the blocking member 111, and to remove oxides, nitrides or other pollutants on the target material 161, also to remove undesired, waste thin film within the reaction chamber 110 and/or the blocking member 111. During the cleaning process of the thin-film-deposition 10, the two shield members 151, 153 are operated into the shielding state, to form the whole shield 15 for keeping away those remove oxides, nitrides or other pollutants from the carrier 115 and/or the substrate 163 thereon.

Moreover, by virtue of two connecting arms 141, 143 to respectively carry one and other halves of the whole shield 15 as the first-shield member 151 and the second-shield member 153, which can reduce loadings of the connecting arms in comparison with conventional shielding device. Also, as the whole shield 15 can be separate into half, this can also improve space efficiency of the reaction chamber, and hence no need of additional storage chamber for containing the shield 15 when not in use.

In one embodiment of the present disclosure as shown in FIG. 9 and FIG. 10, the reaction chamber 110 and/or the containing space 12 may be configured to have a relatively large size, which is sufficient for accommodating the two shield members 151, 153 in the open state, therefore no need of additional containers for storing the shield members 151, 153 as well.

In one embodiment of the present disclosure, as shown in FIG. 9 and FIG. 10, the reaction chamber 110 may be further disposed with a plurality of shield sensors 19 (e.g. optical sensors) within the containing space 12, for respectively detecting locations the first-shield member 151 and the second-shield member 153. The shield sensors 19 are configured to confirm that the first-shield member 151 and the second-shield member 153 are in the open state, thereby to avoid undesired interference, collisions between those movable components as the two connecting arms 141, 143 and the two shield members 151, 152 and the carrier 115. Similar to the position sensors 131, 133, each of the shield sensors 19 may also include an emitter for emitting signal, and a receiver for receiving the signal therefrom.

Figure 11:
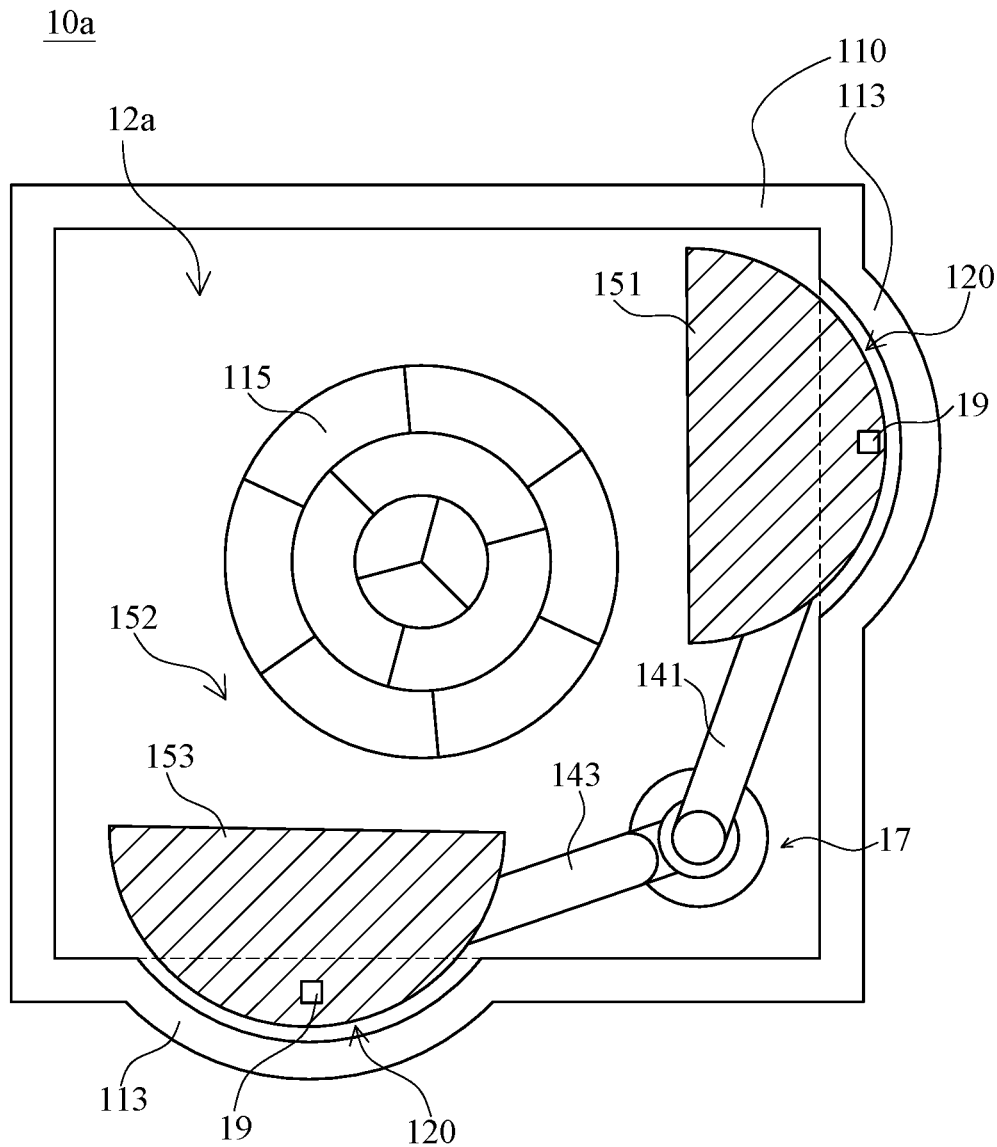
FIG. 11 is a schematic top view illustrating the shielding device of the thin-film-deposition equipment which in is the open state, according to a different embodiment of the present disclosure.

In a different embodiment as shown in FIG. 11, the reaction chamber 110a may be respectively disposed with two sensor areas 113 which are connected to and which protrude from two sides of the reaction chamber 110a respectively. Furthermore, each of the sensor areas 113 has a height shorter than that of the reaction chamber 110a, such that to facilitate mounting the shield sensors 19. In more detail, each of the sensor areas 113 is formed with a sensing space 120 therein which is spatially and fluidly connected to the containing space 12 of the reaction chamber 110a, for partially containing the first-shield member 151 and the second-shield member 153 respectively when the two shield members 151 are operated into the open state. Also to mention that when in the open state, each of the first-shield member 151 and the second-shield member 153 has a relatively small portion within the corresponding sensing space 120, and relatively large portion remaining within the containing space 12. In practical use, each of the sensing spaces 120 of the sensor areas 113 are disposed with at least one shield sensor 19, for respectively detecting and confirming that the two shield members 151, 153 have entered the sensing spaces 120 and been operated into the open state.

Figure 12:
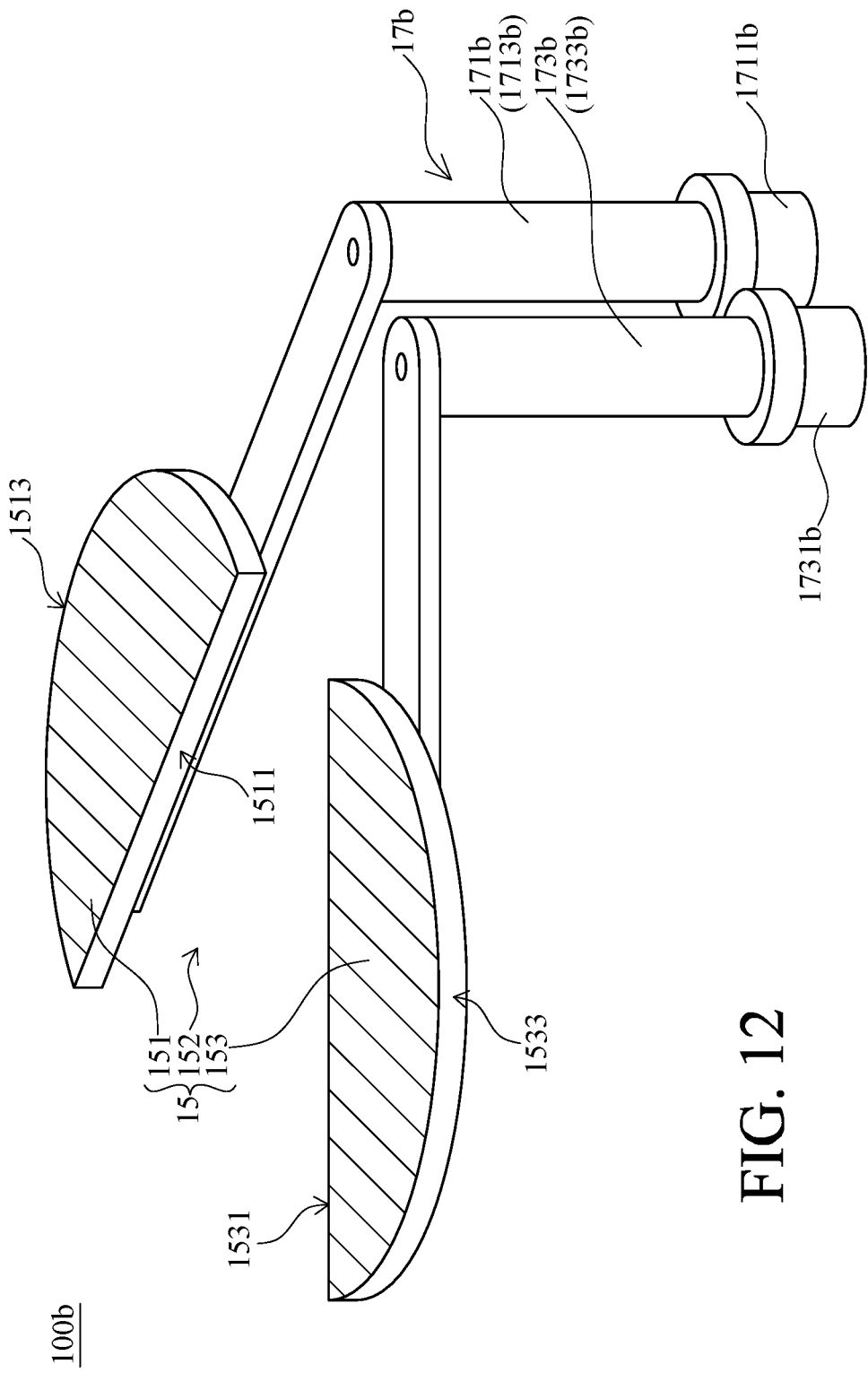
FIG. 12 is a schematic perspective view illustrating the shielding device which is operated into the open state, according to one more embodiment of the present disclosure.

Referring to FIG. 12, which is a schematic perspective view illustrating the shielding device 100b of the thin-film-deposition equipment which is in the open state, according to one more embodiment of the present disclosure. In comparison with the aforementioned embodiment, the driver 17b in this embodiment is configured as a first driver 171b and a second driver 173b. The first driver 171b and the second driver 173b are respectively connected power-transmittably to the first-shield member 151 and the second-shield member 153 via the first-connecting arm 141 and the second-connecting arm 143, such that to drive and swing the first-shield member 151 and the second-shield member 153 to move in the opposite rotational directions. For example, the first-shield member 151 and the second-shield member 153 may synchronously sway in the opposite rotational directions, respectively about an axle of the first driver 171b and an axle of the second driver 173b.

To be specific, the first driver 171b and the second driver 173b can respectively drive, swing the first-shield member 151 and the second-shield member 153 to move away from each other into the open state, or to move toward each other into the shielding state.

In more detail, each of the first driver 171b and the second driver 173b includes at least one motor 1711b, 1731b and a shaft seal 1713b, 1733b, which are structures similar to the aforementioned single motor 171 and shaft seal 175.

Also, in this embodiment, the first driver 171b and the second driver 173b respectively drive main shafts (not shown) of the shaft seals 1713b, 1733b, such that to swing the two shield members 151, 153, whereas outer tubes of the shaft seals 1713b, 1733b are fixed and stationary. According to that, two tongue units 135 are respectively disposed on the main shafts of the shaft seals 1713b, 1733b, therewith, each of the shaft seals 1713b, 1733b has two position sensors 133 disposed adjacent to the main shaft thereof. Such that, as the two drivers 171b, 173b respectively drive and swing the two shield members 151, 153 into the shielding state or the open state, each of the four position sensors 133 can aid to detect that each of the shaft seals 1713b, 1733b has rotated to their first position or second position, and thereby to confirm the shielding state or the open state of the two shielding members 151, 153.

Surely, similar to the aforementioned embodiments, in practical use, the first driver 171a and the second driver 173a may also be configured to combine with the first-shield member 151a and the second-shield member 153a in the embodiment of FIG. 4, respectively via the first-connecting arm 141 and the second-connecting arm 143.

In summary, by virtue of disposing the first-position sensors 131, the second-position sensors 133 and the shield sensors 19, the thin-film-deposition 100 is able to confirm and ensure if the two shield members 151, 153 are operated into the shielding state or the open state. Thereby, the thin-film-deposition 100 is able to prevent a burn-in process for cleaning the reaction chamber 110 being performed when the two shield members 151, 153 are not exactly in the shielding state and hence causing pollution to the carrier 115. In the opposite manner, the thin-film-deposition 100 is also able to prevent the carrier 115 from moving toward the target material 161 when the two shield members 151, 153 are not exactly in the open state and hence causing collision between the carrier 115 and the shield member 151, 153.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A thin-film-deposition equipment, comprising:
    a reaction chamber comprising a containing space;
    a carrier disposed within the containing space for carrying at least one substrate thereon; and
    a shielding device comprising:
        a first-shield member that is disposed within the containing space;
        a second-shield member that is disposed within the containing space;
        at least one driver that comprises
            at least one motor; and
            a shaft seal comprising an outer tube and a main shaft contained within the outer tube, wherein the at least one motor is connected to the first-shield member via the outer tube; the at least one motor is connected to the second-shield member via the main shaft; the at least one motor drives the outer tube and the main shaft to respectively to rotate and swing the first-shield member and the second-shield member in opposite rotational directions and between an open state and a shielding state; when in the shielding state, the first-shield member and the second-shield member approach each other to cover the carrier; and when in the open state, the first-shield member and the second-shield member have an open space therebetween; and
        two first-position sensors disposed adjacent to the outer tube, wherein the two first-position sensors have a distance therebetween; one of the two first-position sensors is for detecting that the outer tube has rotated to a first position, another one of the two first-position sensors is for detecting that the outer tube has rotated to a second position; when the outer tube rotates to the first position, the first-shield member is operated into the open state; and when the outer tube rotates to the second position, the first-shield member is operated into the shielding state.

2. The thin-film-deposition equipment according to claim 1, further comprising two second-position sensors disposed adjacent to the main shaft of the shaft seal of the at least one driver, wherein the two second-position sensors have a distance therebetween; one of the two second-position sensors is for detecting that the main shaft has rotated to a third position, another one of the two second-position sensors is for detecting that the main shaft has rotated to a fourth position; when the main shaft rotates to the third position, the second-shield member is operated into the open state; and when the main shaft rotates to the fourth position, the second-shield member is operated into the shielding state.

3. The thin-film-deposition equipment according to claim 2, further comprising a first-tongue unit and a second-tongue unit, wherein the first-tongue unit is connected to the outer tube; the second-tongue unit is connected to the main shaft; the first-tongue unit rotates with the outer tube to be detected by the first-position sensors; and the second-tongue unit rotates with the main shaft to be detected by the second-position sensors.

4. The thin-film-deposition equipment according to claim 2, wherein the at least one motor is only one that is connected to the outer tube and the main shaft via a gear mechanism, such that to drive the outer tube and the main shaft to rotate in the opposite rotational directions.

5. The thin-film-deposition equipment according to claim 2, wherein the at least one motor are two as a first motor and a second motor; the first motor is connected to and drives the first-shield member via the outer tube; and the second motor is connected to and drives the second-shield member via the main shaft.

6. The thin-film-deposition equipment according to claim 5, wherein the first motor is connected to the outer tube via a transmission unit, and drives the shielding device via the transmission unit.

7. The thin-film-deposition equipment according to claim 1, comprising two sensor areas that are connected to and that protrude from the reaction chamber for partially containing the first-shield member and the second-shield member in the open state respectively, and two shield sensors that are respectively disposed on the two sensor areas for respectively detecting the first-shield member and the second-shield member in the open state.

8. The thin-film-deposition equipment according to claim 1, wherein the first-shield member of the shielding device comprises a first-inner-edge surface formed with at least one protrusion; the second-shield member of the shielding device comprises a second-inner-edge surface formed with at least one cavity; and in the shielding state, the at least one protrusion on the first-inner-edge surface of the first-shield member enters the at least one cavity on the second-inner-edge surface of the second-shield member.

9. A thin-film-deposition equipment, comprising:
   a reaction chamber comprising a containing space;
   a carrier disposed within the containing space for carrying at least one substrate thereon; and
   a shielding device comprising:
   a first-shield member that is disposed within the containing space;
   a second-shield member that is disposed within the containing space;
   at least one driver that comprises
     at least one motor; and
   a shaft seal comprising an outer tube and a main shaft contained within the outer tube, wherein the at least one motor is connected to the first-shield member via the outer tube; the at least one motor is connected to the second-shield member via the main shaft; the at least one motor drives the outer tube and the main shaft to respectively rotate and swing the first-shield member and the second-shield member in opposite rotational directions and between an open state and a shielding state; when in the shielding state, the first-shield member and the second-shield member approach each other to cover the carrier; and when in the open state, the first-shield member and the second-shield member have an open space therebetween; and
   two position sensors disposed adjacent to the main shaft, wherein the two position sensors have a distance therebetween; one of the two position sensors is for detecting that the main shaft has rotated to a first position, another one of the two position sensors is for detecting that the main shaft has rotated to a second position; when the main shaft rotates to the first position, the second-shield member is operated into the open state; and when the main shaft rotates to the second position, the second-shield member is operated into the shielding state.

10. The thin-film-deposition equipment according to claim 9, further comprising a tongue unit that is connected to the main shaft, wherein the tongue unit rotates with the main shaft to be detected by the position sensors.

11. The thin-film-deposition equipment according to claim 10, wherein the at least one motor is only one that is connected to the outer tube and the main shaft via a gear mechanism to drive the outer tube and the main shaft to rotate in the opposite rotational directions.

12. The thin-film-deposition equipment according to claim 10, wherein the at least one motor are two as a first motor and a second motor; the first motor is connected to and drives the first-shield member via the outer tube; and the second motor is connected to and drives the second-shield member via the main shaft.

13. The thin-film-deposition equipment according to claim 9, comprising two sensor areas that are connected to and that protrude from the reaction chamber for partially containing the first-shield member and the second-shield member in the open state respectively, and two shield sensors that are respectively disposed on the two sensor areas for respectively detecting the first-shield member and the second-shield member in the open state.

14. The thin-film-deposition equipment according to claim 9, wherein the first-shield member of the shielding device comprises a first-inner-edge surface formed with at least one protrusion; the second-shield member of the shielding device comprises a second-inner-edge surface formed with at least one cavity; and in the shielding state, the at least one protrusion on the first-inner-edge surface of the first-shield member enters the at least one cavity on the second-inner-edge surface of the second-shield member.

15. A position-detectable shielding device adapted to a thin-film-deposition equipment, comprising:
   a first-shield member;
   a second-shield member;
   at least one driver that comprises
     at least one motor; and
   a shaft seal comprising an outer tube and a main shaft contained within the outer tube, wherein the at least one motor is connected to the first-shield member via the outer tube; the at least one motor is connected to the second-shield member via the main shaft; the at least one motor drives the outer tube and the main shaft to respectively rotate and swing the first-shield member and the second-shield member in opposite rotational directions and between an open state and a shielding state; when in the shielding state, the first-shield member and the second-shield member approach each other; and when in the open state, the first-shield member and the second-shield member have an open space therebetween; and
   two first-position sensors disposed adjacent to the outer tube, wherein the two first-position sensors have a distance therebetween; one of the two first-position sensors is for detecting that the outer tube has rotated to a first position, another one of the two first-position sensors is for detecting that the outer tube has rotated to a second position; when the outer tube rotates to the first position, the first-shield member is operated into the open state; and when the outer tube rotates to the second position, the first-shield member is operated into the shielding state.

16. The position-detectable shielding device according to claim 15, further comprising two second-position sensors disposed adjacent to the main shaft of the shaft seal of the at least one driver, wherein the two second-position sensors have a distance therebetween; one of the two second-position sensors is for detecting that the main shaft has rotated to a third position, another one of the two second-position sensors is for detecting that the main shaft has rotated to a fourth position; when the main shaft rotates to the third position, the second-shield member on the main shaft is operated into the open state; and when the main shaft rotates to the fourth position, the second-shield member is operated into the shielding state.

17. The position-detectable shielding device according to claim 16, further comprising a first-tongue unit and a second-tongue unit, wherein the first-tongue unit is connected to the outer tube; the second-tongue unit is connected to the main shaft; the first-tongue unit rotates with the outer tube to be detected by the first-position sensors; and the second-tongue unit rotates with the main shaft to be detected by the second-position sensors.

18. The position-detectable shielding device according to claim 16, wherein the at least one motor are two as a first motor and a second motor; the first motor is connected to and drives the first-shield member via the outer tube; and the second motor is connected to and drives the second-shield member via the main shaft.

19. The position-detectable shielding device according to claim 18, wherein the first motor is connected to the outer tube via a transmission unit, and drives the shielding device via the transmission unit.

20. The position-detectable shielding device according to claim 16, wherein the at least one motor is only one that is connected to the outer tube and the main shaft via a gear mechanism, such that to drive the outer tube and the main shaft to rotate in the opposite rotational directions.

\* \* \* \* \*